United States Patent
Martin

(10) Patent No.: US 9,831,143 B2
(45) Date of Patent: Nov. 28, 2017

(54) AIR CAVITY PACKAGE

(71) Applicant: MACOM Technology Solutions Holdings, Inc., Lowell, MA (US)

(72) Inventor: Quinn Don Martin, Morrisville, NC (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 0 days.

(21) Appl. No.: 15/254,119

(22) Filed: Sep. 1, 2016

(65) Prior Publication Data

US 2017/0062295 A1    Mar. 2, 2017

Related U.S. Application Data

(60) Provisional application No. 62/212,739, filed on Sep. 1, 2015.

(51) Int. Cl.
| | |
|---|---|
| *H01L 23/495* | (2006.01) |
| *H01L 23/047* | (2006.01) |
| *H01L 23/66* | (2006.01) |
| *H01L 23/498* | (2006.01) |

(52) U.S. Cl.
CPC ...... *H01L 23/047* (2013.01); *H01L 23/49541* (2013.01); *H01L 23/49568* (2013.01); *H01L 23/66* (2013.01); *H01L 23/49861* (2013.01)

(58) Field of Classification Search
CPC ............. H01L 23/047; H01L 23/49541; H01L 23/49861; H01L 23/49568; H01L 23/66
USPC ........................................................ 257/675
See application file for complete search history.

(56) References Cited

U.S. PATENT DOCUMENTS

| | | | |
|---|---|---|---|
| 5,019,892 A * | 5/1991 | Grabbe | ................. H01L 23/057 257/669 |
| 5,185,653 A | 2/1993 | Switky et al. | |
| 6,011,303 A | 1/2000 | Tanaka et al. | |
| 6,421,244 B1 * | 7/2002 | Shinohara | ............... H01L 23/24 257/E23.14 |
| 6,703,692 B1 * | 3/2004 | Pruitt | ................ H01L 23/49503 257/666 |

(Continued)

OTHER PUBLICATIONS

WO Patent Application PCT/US2016/049908 filed on Sep. 1, 2016, International Search Report and the Written Opinion of the International Searching Authority dated Nov. 24, 2016.

*Primary Examiner* — Luan C Thai
(74) *Attorney, Agent, or Firm* — Thomas | Horstemeyer, LLP; Michael J. D'Aurelio; Jason M. Perilla

(57) ABSTRACT

A leadframe and air cavity packages formed using the leadframe are described. Using the leadframe, several air cavity packages can be quickly formed at one time. Further, electrical components can be placed within and interconnected with the air cavity packages easily by repositioning several devices at a time using the leadframe. After assembly, the air cavity packages can be separated from the leadframe. The air cavity packages can include a slug, a plastic frame that surrounds the slug and forms an air cavity, and a cover that encloses the air cavity. The air cavity package further includes one or more conductive leads of the leadframe that extend through the plastic frame and are exposed within the air cavity. The conductive leads can be relied upon to bond out components secured within the air cavity. Finally, the cover can be secured to enclose the air cavity.

20 Claims, 14 Drawing Sheets

(56) References Cited

U.S. PATENT DOCUMENTS

| | | | | |
|---|---|---|---|---|
| 6,774,465 | B2* | 8/2004 | Lee | H01L 23/049 257/671 |
| 6,983,537 | B2* | 1/2006 | Park | H01L 23/49537 257/778 |
| 7,224,047 | B2* | 5/2007 | Carberry | H01L 23/4334 257/433 |
| 7,923,739 | B2* | 4/2011 | Hussell | H01L 25/0753 257/88 |
| 2003/0153128 | A1 | 8/2003 | Ito | |
| 2004/0011699 | A1 | 1/2004 | Park | |
| 2004/0262720 | A1 | 12/2004 | Satou et al. | |
| 2009/0051018 | A1 | 2/2009 | Moline | |
| 2012/0164792 | A1 | 6/2012 | Rotay | |

* cited by examiner

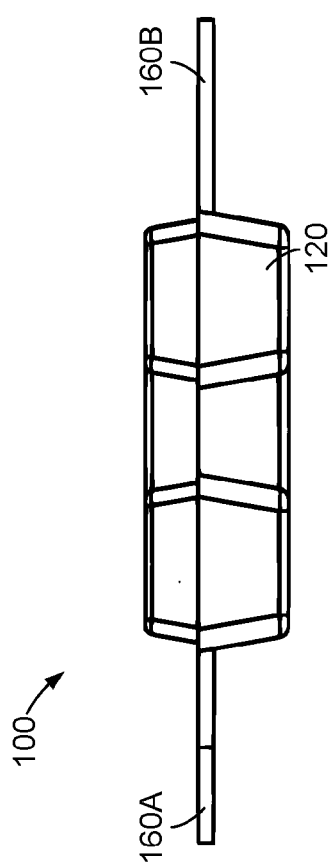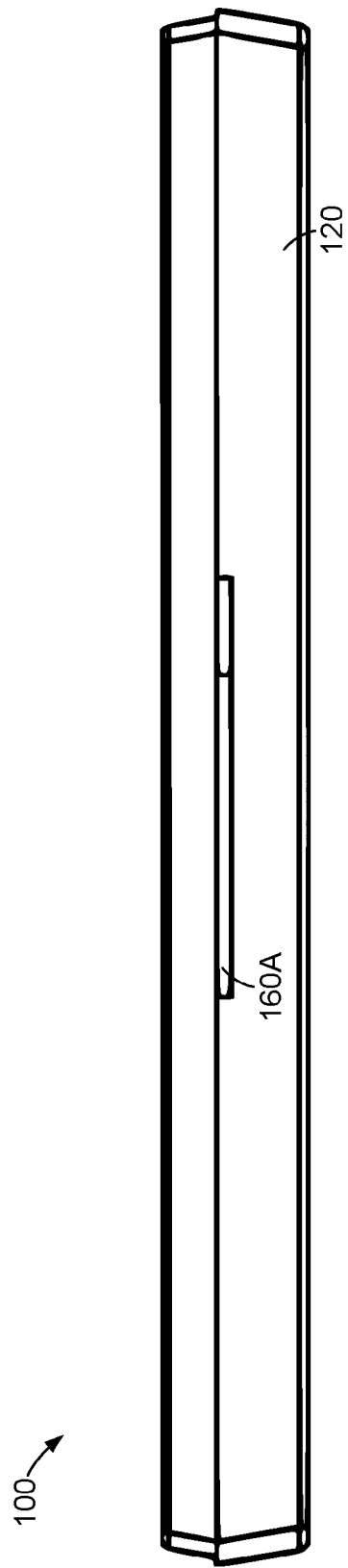

AIR CAVITY PACKAGE

CROSS-REFERENCE TO RELATED APPLICATIONS

This application claims the benefit of U.S. Provisional Application No. 62/212,739, filed Sep. 1, 2015, the entire contents of which is hereby incorporated herein by reference.

BACKGROUND

Various types of packages are available for electrical components, such as active and passive semiconductor devices, resistors, capacitors, and inductors, among other components. The packages can both protect and secure the components and provide electrically conductive leads to make one or more electrical contacts with the components. Such packages can be surface mounted, through-hole mounted, or inserted into printed circuit boards, for example. The type, size, lead style, and materials of any given package can be chosen based on the type of electrical and/or electronics components being housed within them, as well as the application for the components. For example, certain packages can be more or less suitable for high power and/or high frequency components.

BRIEF DESCRIPTION OF THE DRAWINGS

Aspects of the present disclosure can be better understood with reference to the following drawings. It is noted that the elements in the drawings are not necessarily to scale, with emphasis instead being placed upon clearly illustrating the principles of the embodiments. In the drawings, like reference numerals designate like or corresponding, but not necessarily the same, elements throughout the several views.

FIG. 4 illustrates an end view of the example air cavity package shown in FIG. 1 according various embodiments described herein.

FIG. 5 illustrates a side view of the example air cavity package shown in FIG. 1 according various embodiments described herein.

DETAILED DESCRIPTION

As noted above, various types of packages are available for electrical components, such as semiconductor devices, resistors, capacitors, and inductors, among others. The type, size, lead style, and materials of any given package can be chosen based on the type of electrical and/or electronics components being housed within, as well as the application for the components.

Certain packages can be more or less suitable for high power and/or high frequency components. For example, flat no-leads packages such as quad-flat no-leads (QFN) packages can be used to physically secure and electrically connect integrated circuits to printed circuit boards (PCBs). Flat no-leads packages are one of several types of packages that can be used to connect integrated circuits and other electrical components to PCBs without through holes. Among packages, air cavity packages having an air cavity designed into the package and plastic-molded packages in which air in the package is minimized are common. For certain components, such as those used in high-frequency applications, air cavity packages are preferable because, among other advantages, dielectric capacitances can be minimized. Some air cavity packages have disadvantages, however, because they incorporate expensive materials and rely upon complex or time-consuming manufacturing and assembly processes.

In the context outlined above, the embodiments described herein are directed to an air cavity package including a heat slug having first and second major surfaces and an interlocking edge surface or side, a plastic frame or body that surrounds the interlocking edge surface and forms an air cavity, and a cover that encloses the air cavity. The air cavity is bounded in part by the first major surface of the heat slug and includes first and second platform levels within the air cavity. The air cavity package further includes one or more conductive leads that extend from outside the plastic frame, through at least a portion of the plastic frame or body, and are exposed within the air cavity along the first platform level. Being exposed along the first platform level, the conductive leads can be relied upon to bond out at least one electrical contact of a component secured within the air cavity. After one or more components, such as III-Nitride based transistors, for example, are secured within the air cavity and bonded out or electrically connected to the one or more conductive leads at the first platform level, the cover is seated and secured to the second platform level, which is higher than the first platform level within the air cavity.

Figure 1:
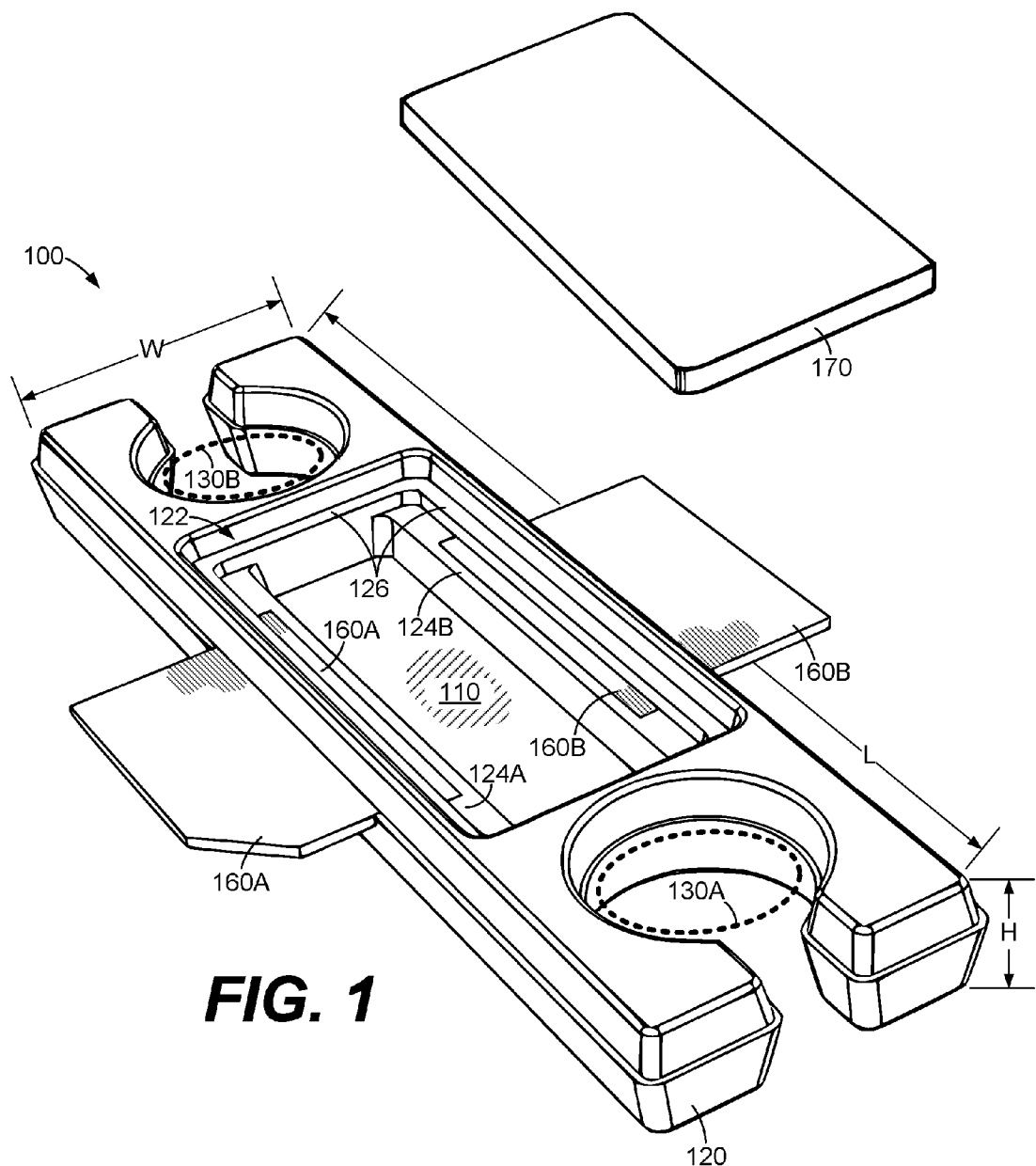
FIG. 1 illustrates a perspective view of an example air cavity package according various embodiments described herein.
Figure 2:
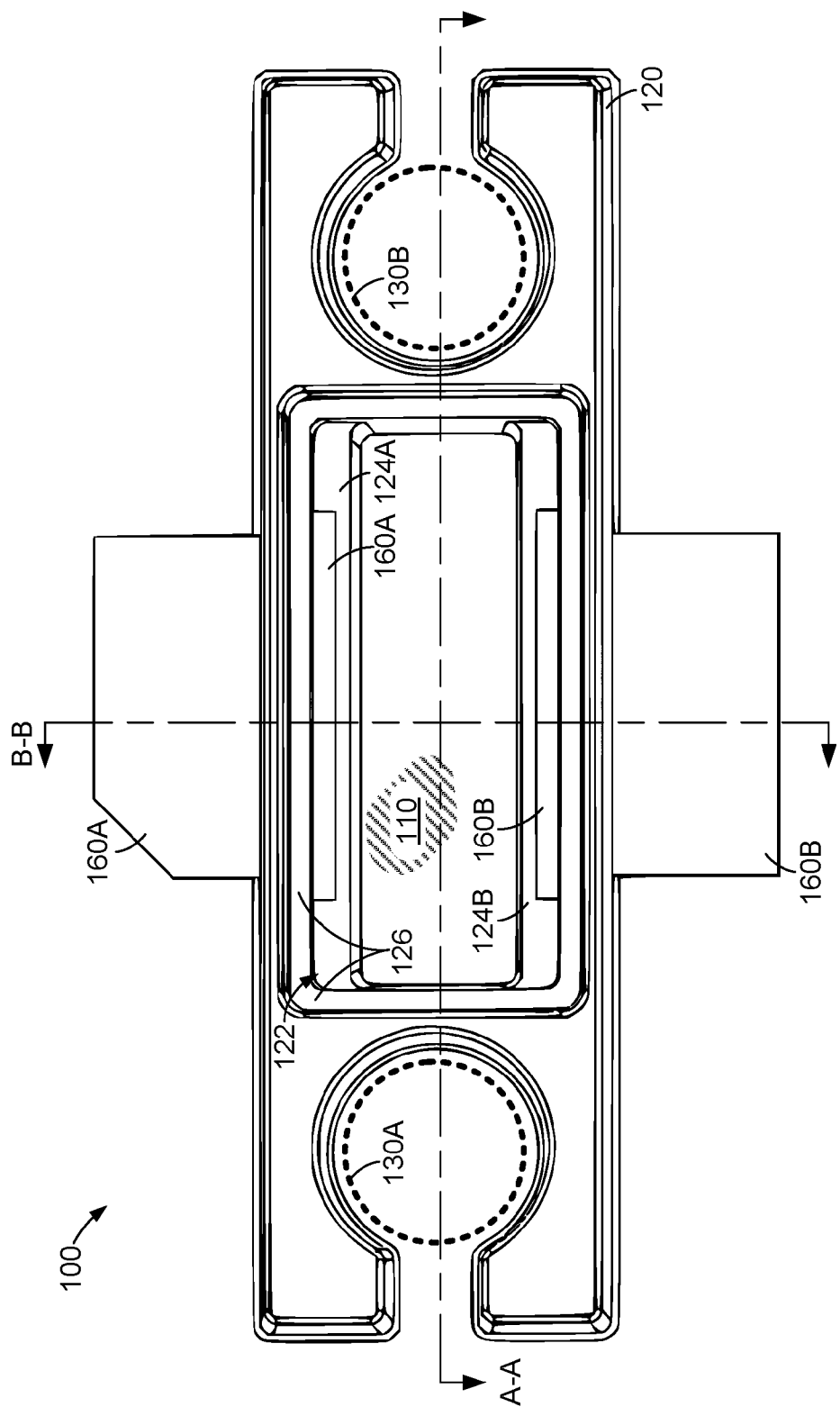
FIG. 2 illustrates a top view of the example air cavity package shown in FIG. 1 according various embodiments described herein.
Figure 3:
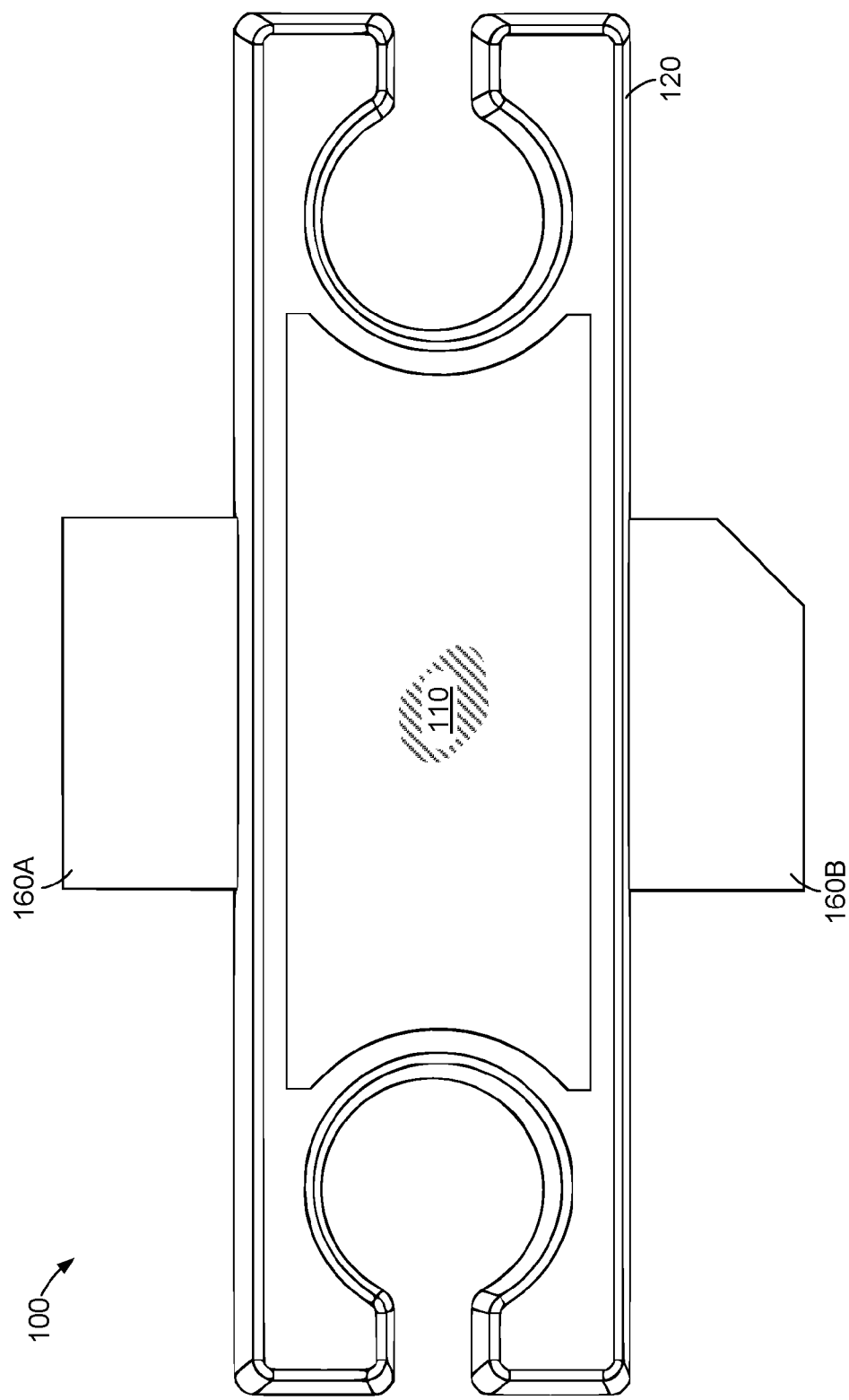
FIG. 3 illustrates a back view of the example air cavity package shown in FIG. 1 according various embodiments described herein.

Turning to the drawings, FIG. 1 illustrates a perspective view of an example air cavity package 100 according various embodiments described herein. Further, FIG. 2 illustrates a top view, FIG. 3 illustrates a back view, FIG. 4 illustrates an end view, and FIG. 5 illustrates a side view of the example air cavity package 100 shown in FIG. 1 according to various embodiments described herein.

As shown among the views, the air cavity package 100 includes a slug 110 and a plastic frame 120 that substantially surrounds an edge of the slug 110 to form an air cavity 122 bounded in part by a first major surface (e.g., top or bottom) of the slug 110. The plastic frame 120 includes the apertures 130A and 130B (collectively, apertures 130), a first platform level including a left side platform 124A and a right side platform 124B (collectively, first platform level 124), and a second platform level 126. The air cavity package 100 further includes a first conductive lead 160A and a second conductive lead 160B (collectively, conductive leads 160). The conductive leads 160 extend from outside the plastic frame 120 through at least a portion of the plastic frame 120. Inside the air cavity 122, a portion of the surfaces of the conductive leads 160 are exposed at the first platform level 124. As described in further detail below, electrical components can be mounted and secured inside the air cavity 122 and wire-bonded out to the surfaces of the conductive leads 160 that are exposed at the first platform level 124. The air cavity package 100 also includes a cover 170.

Before turning to specific aspects of the air cavity package 100, it is noted that the embodiment shown in FIGS. 1-5 is provided by way of example only. The embodiment is not drawn to scale, and other embodiments consistent with the concepts described herein can vary in shape and/or size as compared to that shown. For example, the length "L," width "W," and height "H" of the plastic frame 120 can vary among embodiments, for example, to achieve a suitable size for the air cavity 122. Similarly, as described below with reference to FIG. 10, the size, number, and positions of the conductive leads 160 can vary among embodiments. Additionally, in other embodiments, the apertures 130 can vary in number, size, shape, and position from that shown, or be omitted entirely.

After the air cavity package 100 is constructed, any number of active and/or passive electronics components can be mounted and secured within the air cavity 122. The components can be mechanically and/or electrically coupled, individually, to the slug 110. The components can be mechanically bonded or coupled using adhesives, mechanical fasteners, etc., and/or electrically bonded or coupled using a conductive epoxy, sintered die attach material, a suitable type of solder, etc. In various embodiments, the slug 110 can be formed from copper, aluminum, tin, silver, gold, zinc, other metals, diamond, graphite, or any compositions thereof. The slug 110 can also be coated or plated with a material, such as gold, silver, copper, nickel, palladium, etc., which can improve the mechanical and/or electrical performance of the air cavity package 100 or assist in the adhesion of other components to the slug 110. When formed from an electrically conductive material and/or coating, such as copper, the slug 110 can act both as an electrical contact and a heatsink.

As shown, the slug 110 includes a first major (e.g., top) surface shown in FIG. 1, a second major (e.g., bottom) surface shown in FIG. 3, and an interlocking edge surface which is described in further detail below with reference to FIGS. 7 and 8. The interlocking edge surface is described in further detail below with reference to FIGS. 7 and 8. From the bottom of the air cavity package 100 (FIG. 3), heat can be conducted away from the slug 110. Thus, heat from any electrical components within the air cavity 122 can be drawn away from the air cavity package 100.

In other cases, if the components within the air cavity 122 are mounted and/or secured but not electrically coupled to the slug 110, the slug 110 can act as a heat sink but not an electrical contact. In other embodiments, the slug 110 can be formed from a semiconductor, ceramic, or plastic material. In still other cases, the slug 110 can be omitted, with its area shown in FIG. 1 being filled by the plastic frame 120.

Any components within the air cavity 122 can be wire-bonded to the exposed portions of the conductive leads 160 along the first platform level 124 using any suitable wire-bonding technology. Specifically, as shown in FIG. 1, the conductive lead 160A extends from outside the plastic frame 120, through at least a portion of the plastic frame 120, and is exposed within the air cavity 122 along the left side platform 124A. Similarly, the conductive lead 160B extends from outside the plastic frame 120, through at least a portion of the plastic frame 120, and is exposed within the air cavity 122 along the right side platform 124B. Thus, electrical contacts on any semiconductor or other electrical devices within the air cavity 122 can be wire-bonded out to the exposed portions of the conductive leads 160A and/or 160B along the first platform level 124. From outside the air cavity package 100, electrical connections can be made directly to the conductive leads 160A and/or 160B, as well as to the slug 110, as described above. A more particular example of components secured within the air cavity 122 and wire-bonded out to the conductive leads 160 is described below with reference to FIG. 11.

Figure 6:
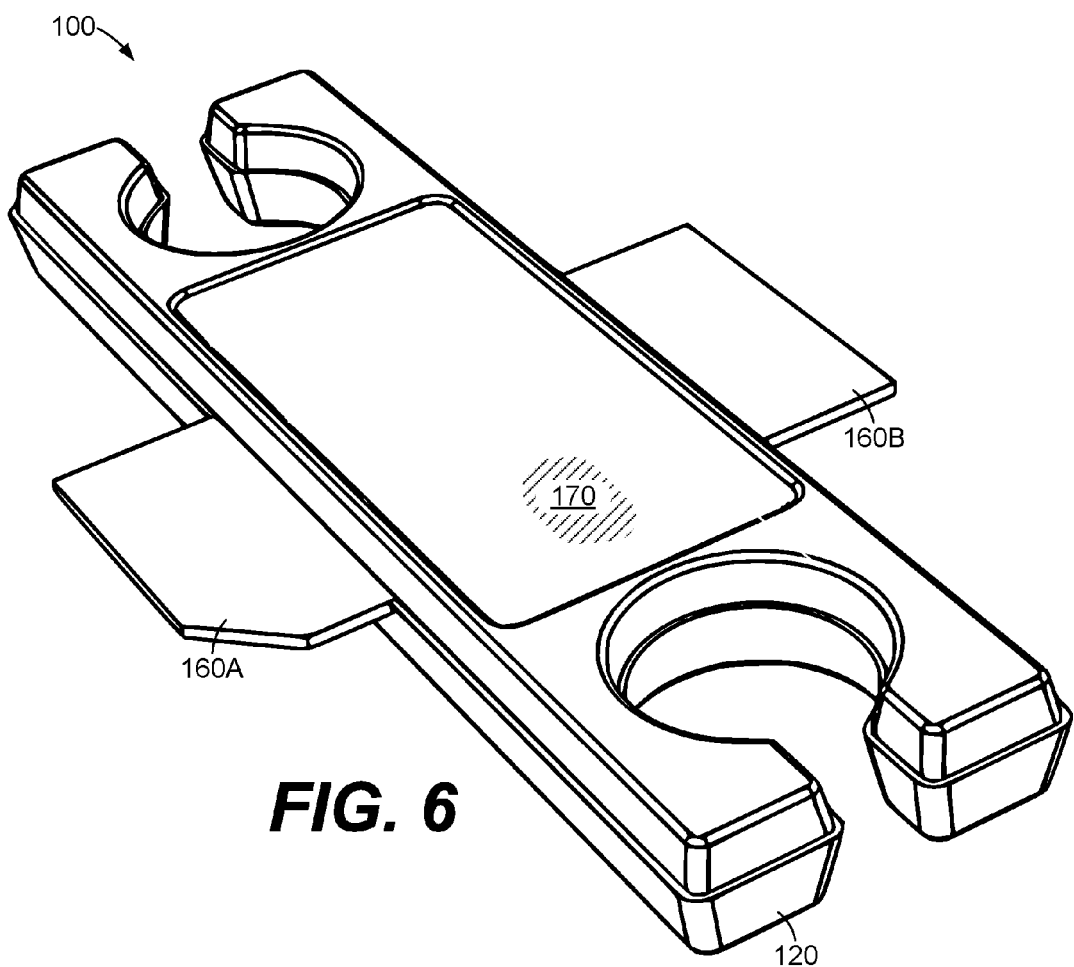
FIG. 6 illustrates a perspective view of the example air cavity package shown in FIG. 1 including a cover to enclose the air cavity according various embodiments described herein.

After wire-bonding, the cover 170 can be seated upon and secured to the second platform level 126 using any suitable adhesives or plastic welding, heating, or melting processes. As shown in FIG. 1, the second platform level 126 is higher than the first platform level 124 within the air cavity 122. Thus, once the cover 170 is secured to the second platform level 126, the air cavity 122 is enclosed within the air cavity package 100. An example of air cavity package 100 with the cover 170 secured to the second platform level 126 is shown in FIG. 6.

Again, because any components within the air cavity 122 are not surrounded by (i.e., in contact with) the plastic frame 120, they are not subject to the same electrical effects due to the materials of the plastic frame 120 (e.g., parasitic capacitances, etc.). As such, the air cavity package 100 can be particularly useful for components used in certain fields or applications, such as high power and/or higher frequency applications.

The plastic frame 120 can be molded out of any suitable plastic (or similar) material(s), such as epoxy, liquid crystal polymer (LCP), silicone, or polymide resins or blends, with or without glass, carbon, or other reinforcements, among other materials. The material(s) of the plastic frame 120 can be selected to provide or achieve adequate protection (e.g., an adequate level of temperature sensitivity, vibration sensitivity, moisture sensitivity, or other sensitivity level etc.) for the components within the air cavity 122, mechanical strength to secure the conductive leads 160, adequate matching of the thermal expansion to other materials in the package, or other relevant factors.

In some embodiments, such as for aerospace or radiation environments, an air cavity package similar to the air cavity package 100 can be formed as a ceramic package having an air cavity. In that case, an encapsulation shell similar to the plastic frame 120 can be formed from a ceramic material and the cover 170 can be formed as a metal or glass lid secured using any suitable methods to create a hermetic (or near hermetic) seal.

The conductive leads 160A and 160B can be cut away from a larger leadframe assembly after construction of the air cavity package 100 along with other, similar air cavity packages. The construction of the air cavity package 100 using a leadframe assembly is described in further detail below with reference to FIG. 12. The conductive leads 160A and 160B can be formed from copper, aluminum, tin, silver, gold, zinc, other metals, or any compositions thereof, and can be plated with silver or gold, for example, using spot-plating or other methods.

Figure 7:
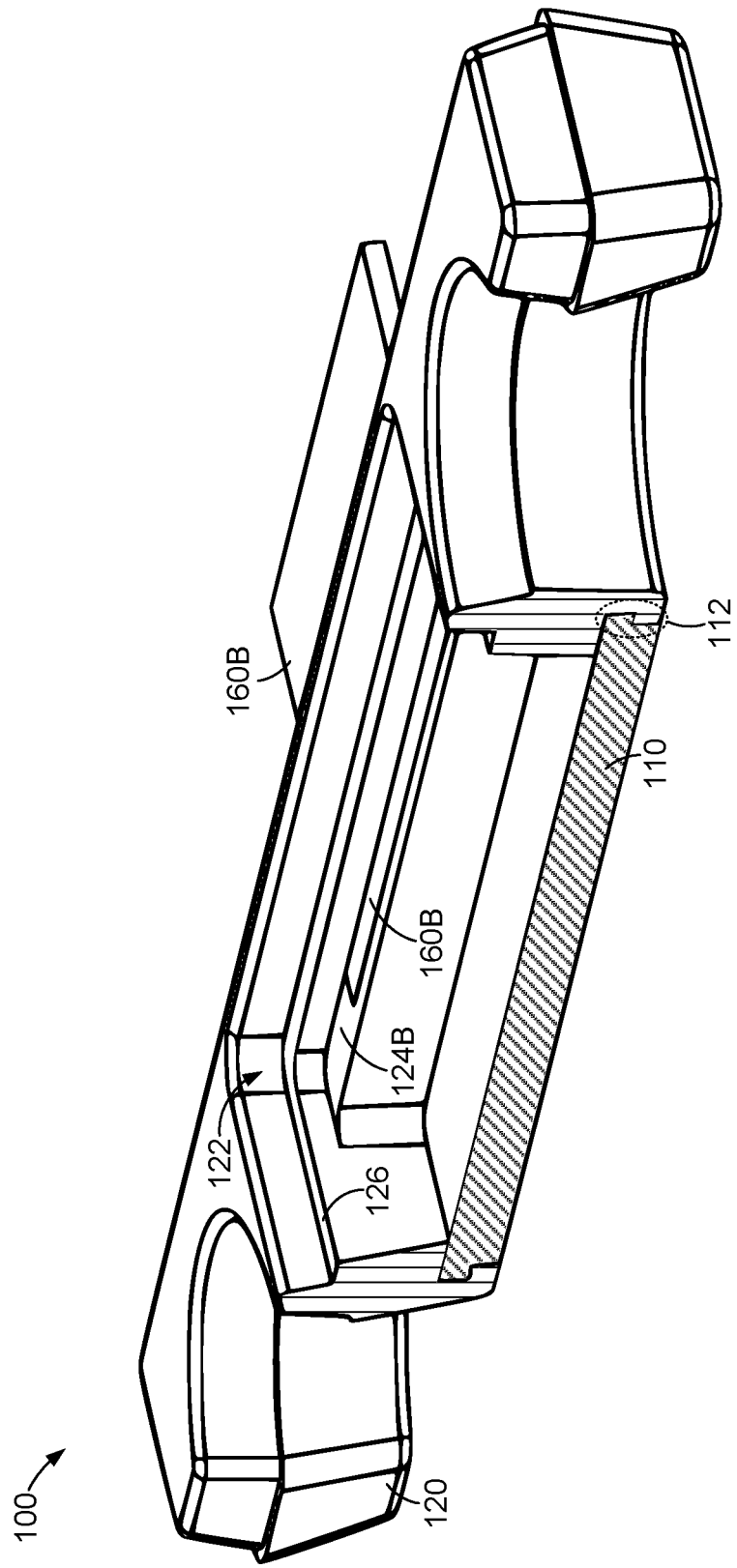
FIG. 7 illustrates the sectional view A-A of the example air cavity package designated in FIG. 2 according to various embodiments described herein.

FIG. 7 illustrates the sectional view A-A of the example air cavity package 100 designated in FIG. 2 according to various embodiments described herein. As shown in FIG. 7, the plastic frame 120 surrounds an interlocking edge surface 112 of the slug 110 and forms the air cavity 122 bounded in part by the top surface of the slug 110. The interlocking edge surface 112 includes a lip or tooth that runs around the outer peripheral top edge of the slug 110, as compared to its bottom peripheral edge. Because the plastic frame 120 surrounds the lip or tooth of the interlocking edge surface 112, the slug 110 cannot be easily pulled out from the plastic frame 120 or the bottom of the air cavity package 100.

In FIG. 7, it is also clear that the first platform level 124 (i.e., the right side platform 124B and the left side platform 124A (FIG. 8)) is formed as a raised platform level above the top surface of the slug 110, and the second platform level 126 is formed as a raised platform level above top surface of the slug 110 (and above the first platform level 124). The first and second platform levels 124 and 126 can be formed at any desirable height above the top surface of the slug 110 depending upon design and application considerations, the size of the air cavity package 100, and other factors. Because the first platform level 124 is raised above the top surface of the slug 110 in the air cavity 122, the amount of parasitic capacitance between the top surface of the slug 110 and the conductive leads 160 exposed along the first platform level 124 can be reduced and/or minimized.

Figure 8:
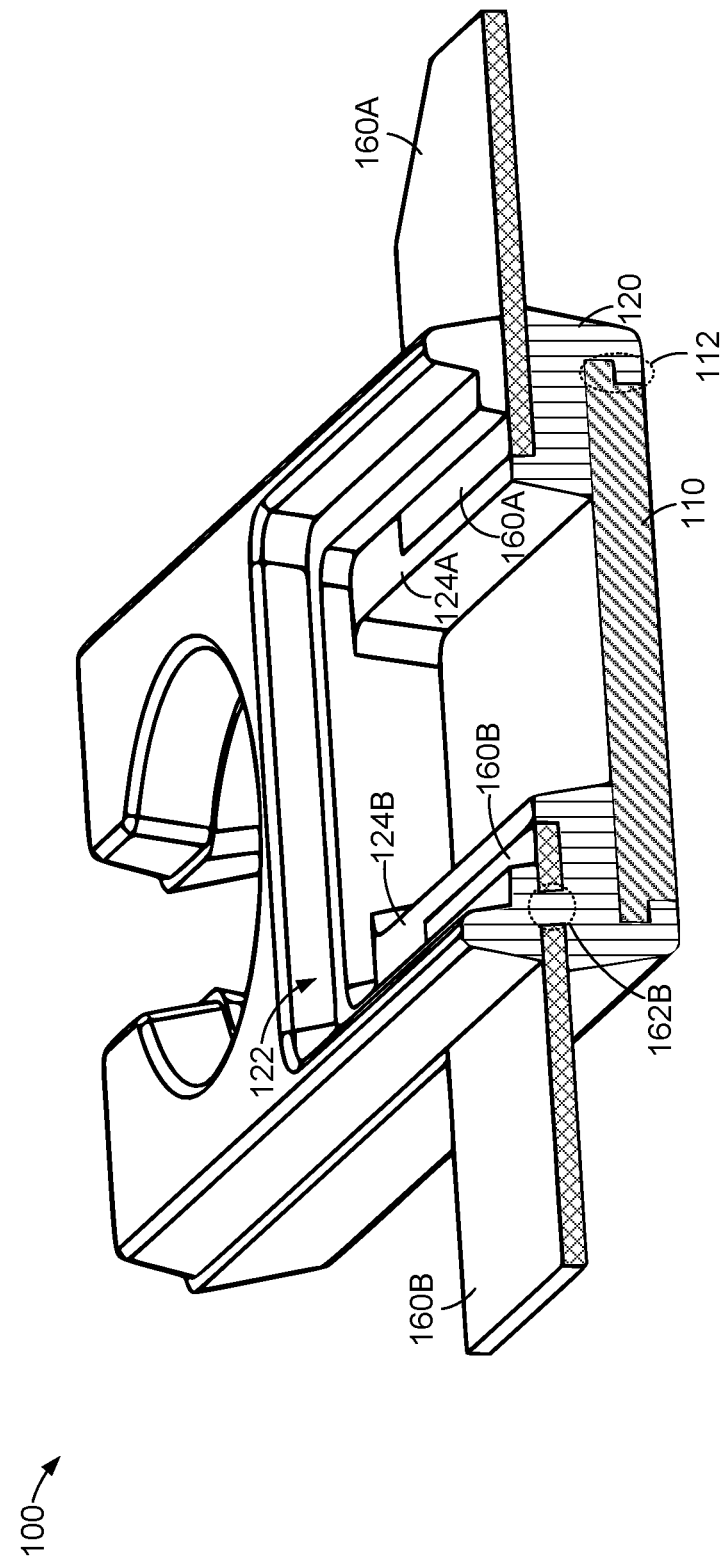
FIG. 8 illustrates the sectional view B-B of the example air cavity package designated in FIG. 2 according to various embodiments described herein.

FIG. 8 illustrates the sectional view B-B of the example air cavity package 100 designated in FIG. 2 according to various embodiments described herein. The plastic frame 120 surrounds an interlocking edge surface 112 of the slug 110 and forms the air cavity 122 bounded in part by the top surface of the slug 110. In FIG. 8, it is clear how the conductive leads 160A and 160B extend from outside the plastic frame 120, through the plastic frame 120, and are exposed within the air cavity 122 along the left side platform 124A and the right side platform 124B, respectively. Further, as shown, an aperture 162B is formed through the conductive lead 160B, and the plastic frame 120 is formed through the aperture 162B. The conductive lead 160A also includes apertures, but none are shown in the sectional view B-B shown in FIG. 8. As described in further detail below with reference to FIG. 9, both the conductive leads 160A and 160B include staggered apertures (including the aperture 162B), and the plastic frame 120 is formed through (e.g., flows through) the staggered apertures. In that way, the conductive leads 160A and 160B are securely fixed in the plastic frame 120.

Figure 9:
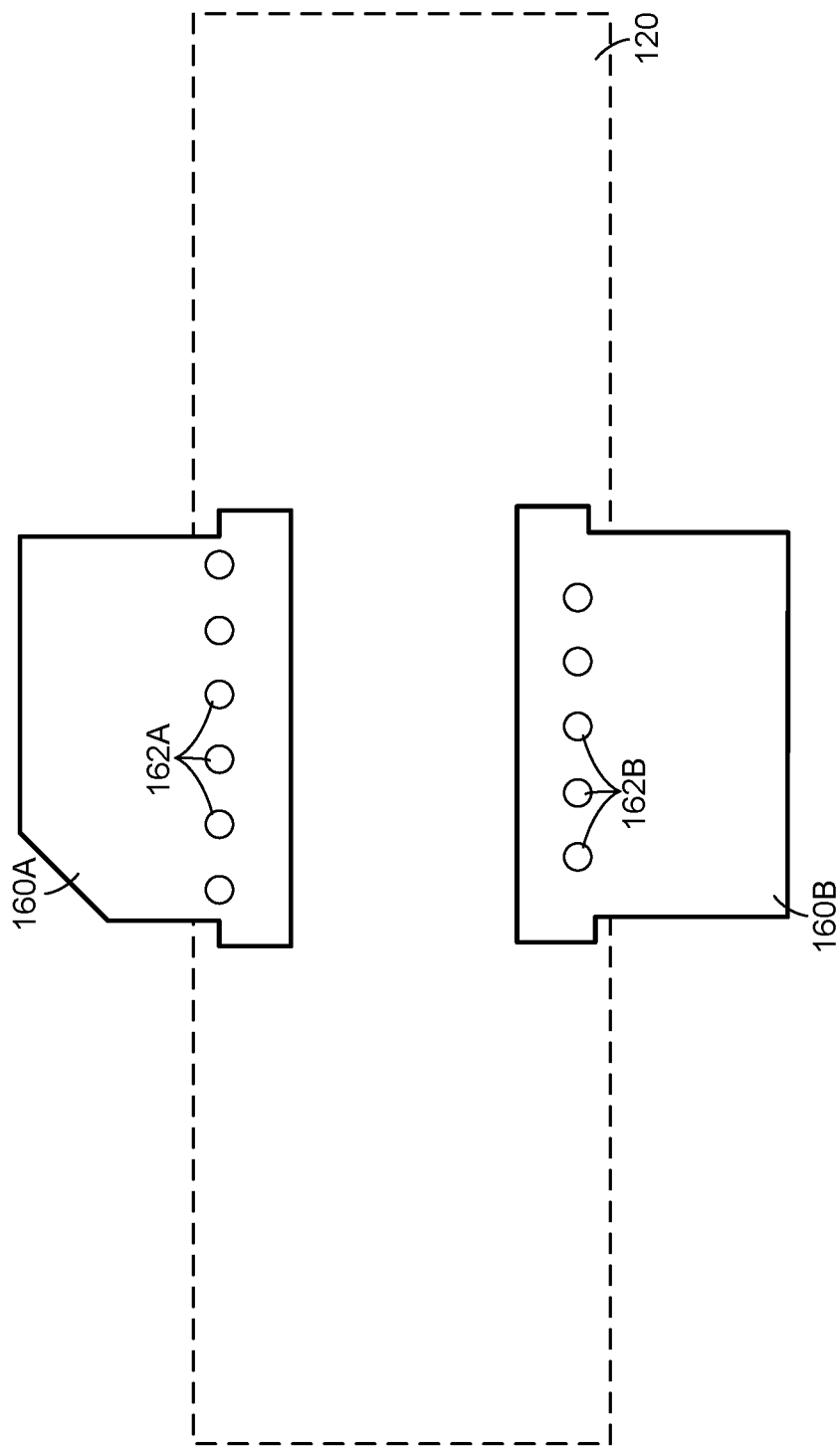
FIG. 9 illustrates example outlines of the leads in the example air cavity package shown in FIG. 1 according to various embodiments described herein.

FIG. 9 illustrates example outlines of the conductive leads 160A and 160B in the example air cavity package shown in FIG. 1 according to various embodiments described herein. In FIG. 9, the plastic frame 120 is shown as a bounding box, and the conductive leads 160A and 160B are exposed. In this view, the staggered apertures 162A can be seen through the conductive lead 160A and the staggered apertures 162B can be seen through the conductive lead 160B. In FIG. 9, the size, shape, number, and placement of the apertures 162A and 162B are provided by way of example. In other embodiments, the conductive leads 160A and 160B can include larger, smaller, fewer, or greater apertures at any suitable location(s). In some embodiments, the apertures 162A and 162B can be omitted entirely. When the plastic frame 120 is molded around the slug 110, it can flow through the apertures 162A and 162B to secure the conductive leads 160A and 160B fixedly with the plastic frame 120.

Figure 10:
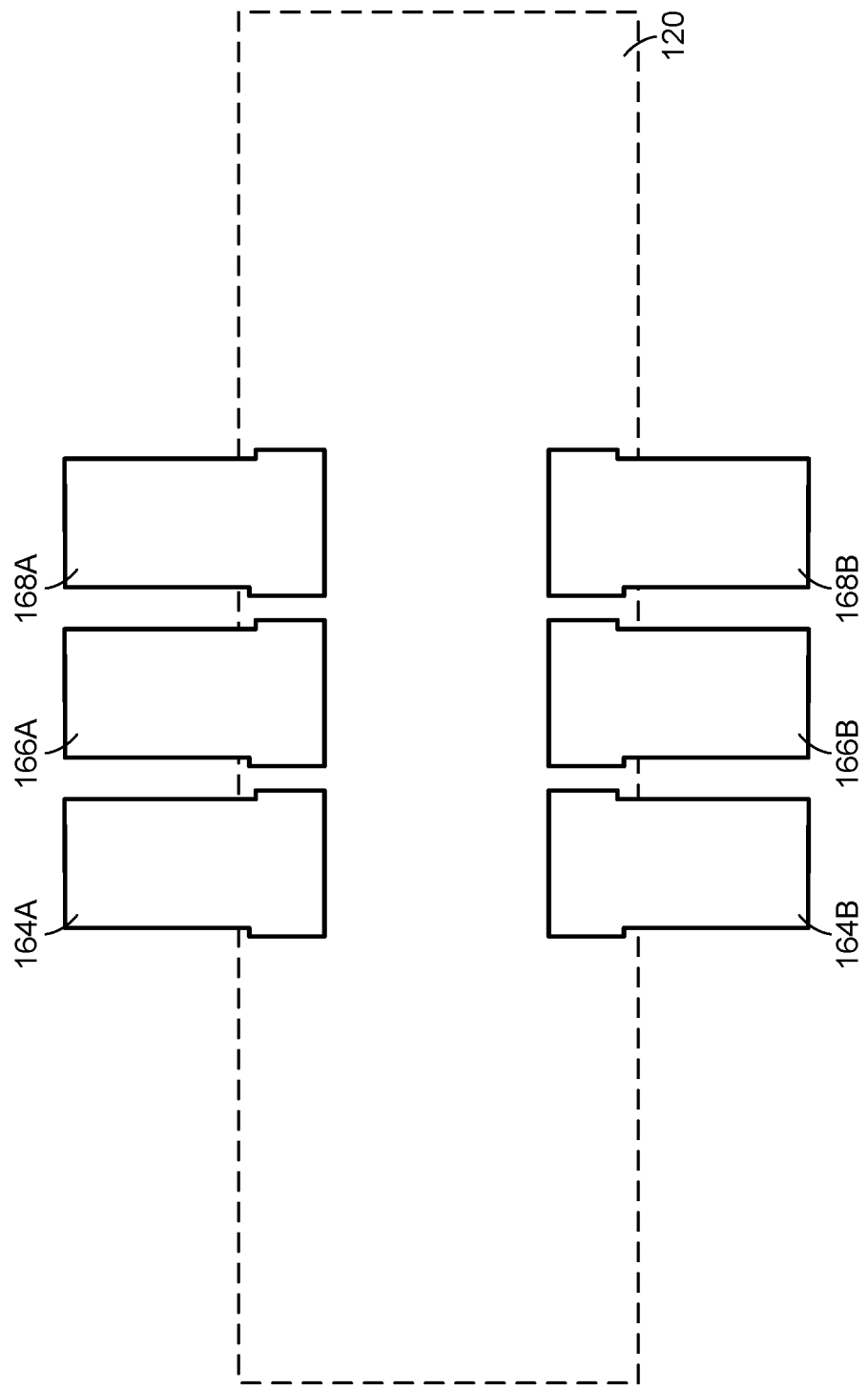
FIG. 10 illustrates example outlines of other representative leads that can be used in air cavity packages according to various embodiments described herein.

FIG. 10 illustrates example outlines of other representative leads that can be used in air cavity packages. The embodiment shown in FIG. 10 includes three conductive leads 164A, 166A, and 168A on one side of the plastic frame 120, and three conductive leads 164B, 166B, and 168B on another side of the plastic frame 120. In this configuration, additional isolated electrical contacts can be supported through the use of additional conductive leads. Any number of conductive leads can be used on each side of any given air cavity package depending upon various design factors, such as package size, current capacity, etc.

Figure 11:
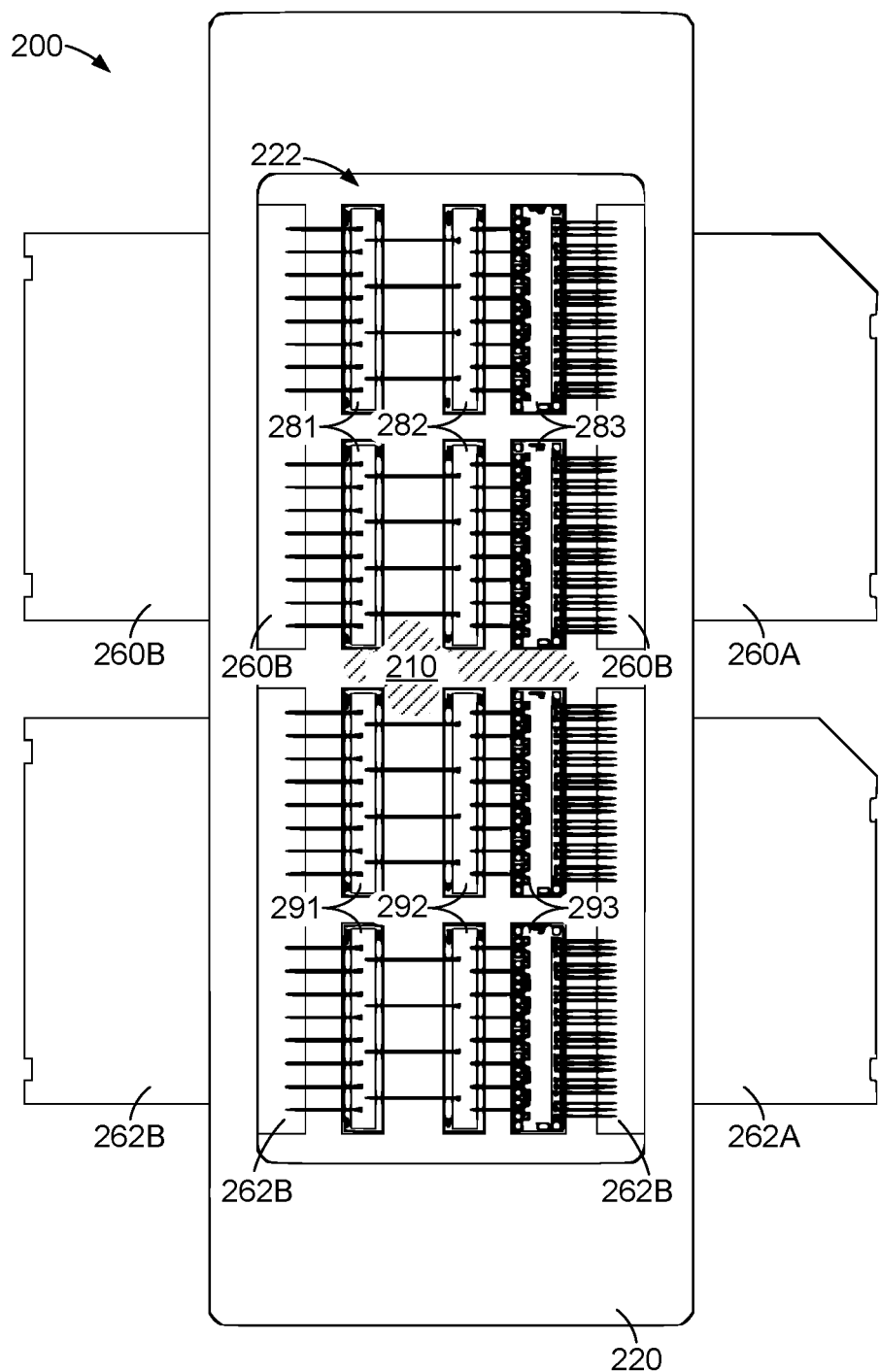
FIG. 11 illustrates a top view of an example air cavity package including components within an air cavity according to various embodiments described herein.

FIG. 11 illustrates a top view of an example air cavity package 200 including components within an air cavity 222 according to various embodiments described herein. In FIG. 11, the components 281-283 and 291-293 are secured to the slug 210 within the air cavity 222. Further, the components 281 are electrically coupled by wire bonds between the conductive lead 260B and the components 282, the components 282 are electrically coupled by wire bonds between the components 281 and the components 283, and the components 283 are electrically coupled by wire bonds between the components 282 and the conductive lead 260A. Similarly, the components 291 are electrically coupled by wire bonds between the conductive lead 262B and the components 292, the components 292 are electrically coupled by wire bonds between the components 291 and the components 293, and the components 293 are electrically coupled by wire bonds between the components 292 and the conductive lead 262A. The arrangement of the components 281-283 and 291-293 shown in FIG. 11 is provided by way of example, as other arrangements of components (e.g., positions, interconnections, etc.) are within the scope of the embodiments.

Various types of active and passive electronics components, such as integrated circuits formed on semiconductor substrates (formed in any semiconductor processing technology), including arrangements of transistors, resistors, capacitors, and inductors, among other components, discrete electronics components, electro-optical components, electro-mechanical components, and other components and combination thereof, without limitation, can be placed, arranged, and secured within the air cavity 222 of the air cavity package 200 (and the air cavity package 100). Thus, the components 281-283 and 291-293 shown in FIG. 11 are shown by way of example only. For example, the components 283 and 293 can be III-Nitride (III-N) material or Gallium Nitride (GaN) material semiconductor devices, such as GaN-on silicon or GaN-on-SiC transistor die, for example, and the components 281, 282, 291, and 292 can be capacitors, although the use of other devices is within the scope of the embodiments.

Figure 12:
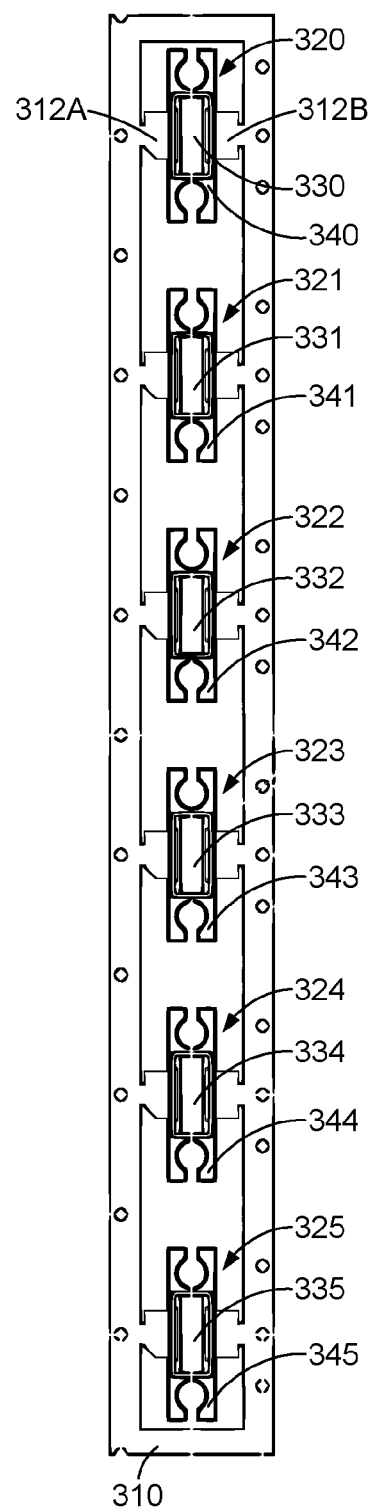
FIG. 12 illustrates an example leadframe and air cavity packages according to various embodiments described herein.

FIG. 12 illustrates an example leadframe 310 and air cavity packages 320-325 according to various embodiments described herein. Each of the air cavity packages 320-325 is similar to the air cavity package 100 described and illustrated above. The leadframe 310 can be formed (e.g., cut, sheared, pressed out, etc.) from a larger strip or sheet of conductive metal or metals, such as copper, aluminum, tin, silver, gold, zinc, other metals, or any compositions thereof, and can be plated with silver or gold, for example, using spot-plating or another method. As shown in FIG. 12, the leadframe 310 includes conductive leads 312A and 312B for the air cavity package 320 and similar conductive leads (not individually referenced) for the other air cavity packages 321-325. The leadframe 310 shown in FIG. 12 is provided by way of example, and larger or smaller leadframes can be relied upon in the embodiments.

Use of the leadframe 310 as a starting point for the manufacture of the air cavity packages 320-325 offers various benefits, including significantly higher assembly throughputs, lower cost, higher precision, and the ability to use the existing tool sets and equipment of manufacturers and suppliers. For example, the leadframe 310 can be used to grip, hold, and move a relatively large number of air cavity packages without repositioning them individually. Further, once the leadframe 310 is formed at a suitable level of precision, the relative spacing of each of the air cavity packages 320-325, once formed, is known. Thus, electrical components, such as III-Nitride material devices, among other types of devices, can be placed and interconnected within each of the air cavity packages 320-325 easily by machines, without the need to move and reposition the air cavity packages 320-325 individually.

During manufacturing, the leadframe 310 can be arranged into the correct relative position along with the slugs 330-335. Then, a mold can be placed around the leadframe 310 and the slugs 330-335, and plastic can be injected into the mold to form the plastic frames 340-345. The air cavity packages 320-325 can be kept attached to the leadframe 310 during the remaining assembly processes, during which electrical components can be placed and interconnected within each of the air cavity packages 320-325 by machines.

Keeping the air cavity packages in the leadframe during the assembly process allows for higher throughputs and lower assembly costs. After assembly is complete, the individual air cavity packages 320-325 can then be separated from the leadframe 310 by cutting or shearing the leadframe 310 at locations to separate the conductive leads 312A and 312B (and the other conductive leads) for each of the air cavity packages 320-325.

Figure 13:
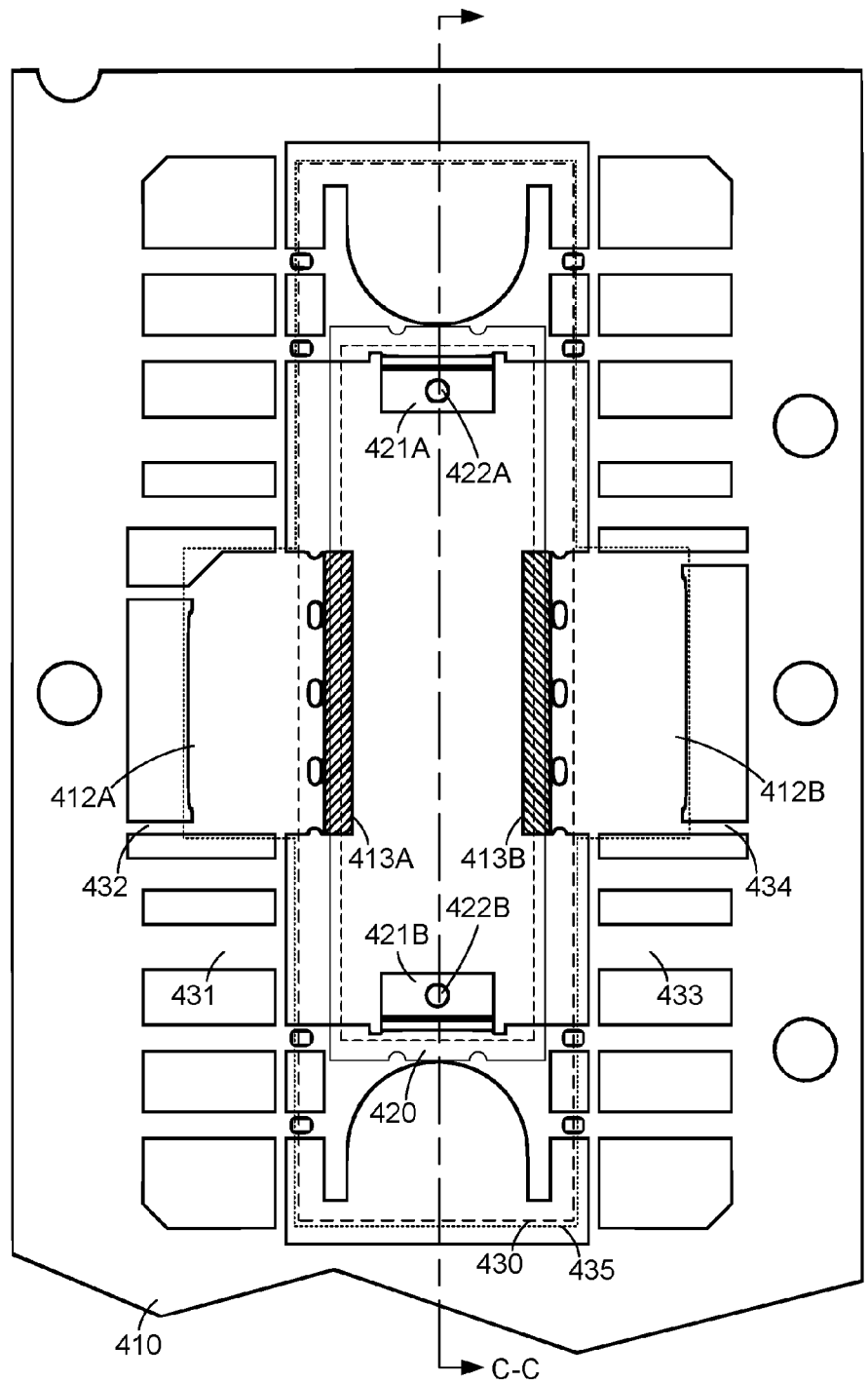
FIG. 13 illustrates a part of an example leadframe arranged with a slug for constructing air cavity packages according to various embodiments described herein.

FIG. 13 illustrates a part of an example leadframe 410 arranged with a slug 420 for constructing air cavity packages according to various embodiments described herein. A bounding box 430 is also shown in FIG. 13. The bounding box 430 is representative of the size of the plastic frame or body of the air cavity package to be formed around the part of the leadframe 410 shown in FIG. 13. The leadframe 410 shown in FIG. 13 is provided by way of example, and larger or smaller leadframes can be relied upon in the embodiments.

Consistent with the description above, the leadframe 410 can be formed (e.g., cut, sheared, pressed out, etc.) from a larger strip or sheet of conductive metal or metals, such as copper, aluminum, tin, silver, gold, zinc, other metals, or any compositions thereof, and can be plated with silver or gold, for example, using spot-plating or another method. Among other features, the leadframe 410 includes the conductive leads 412A and 412B, downset facets 421A and 421B, and a number of leadframe structure supports 431-434 (among others shown but not individually referenced in FIG. 13). The portions 413A and 413B of the conductive leads 412A and 412B, respectively, that will be exposed within the air cavity of the air cavity package are designated by hatching in FIG. 13.

The downset facets 421A and 421B can be used to secure the slug 420 to the leadframe 410 before a mold is placed around them for the injection of the plastic frame or body of the air cavity package. In one example case, metal rivets, pins, or bolts can inserted through the apertures 422A and 422B in the downset facets 421A and 421B to fasten the slug 420 to the leadframe 410. Other fastening means can be used, however, including solder, adhesives, wire-bonds, etc., and the apertures 422A and 422B can be omitted in some embodiments.

Once fastened together, a mold can be placed around the leadframe 410 and the slug 420, and plastic can be injected into the mold to form a plastic frame or body of the air cavity package about the size of the bounding box 430. The air cavity package thus formed can be kept attached to the leadframe 410 during the remaining assembly processes, during which electrical components can be placed and interconnected within the air cavity package. A process of leadframe air cavity package device assembly or manufacturing is described in further detail below with reference to FIG. 15.

Figure 14:
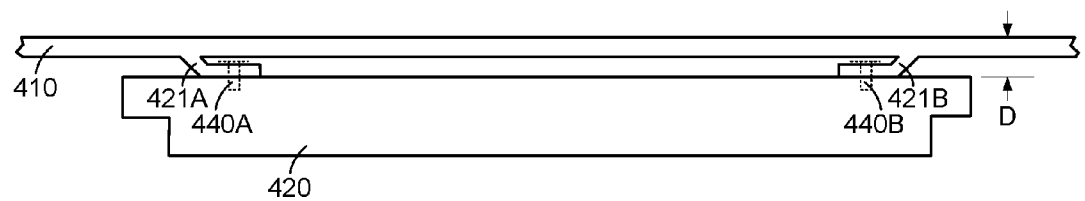
FIG. 14 illustrates the sectional view C-C of the leadframe arranged with the slug designated in FIG. 13 according to various embodiments described herein.

FIG. 14 illustrates the sectional view C-C of the leadframe 410 arranged with the slug 420 designated in FIG. 13 according to various embodiments described herein. As shown in FIG. 14, fasteners 440A and 440B are inserted through the downset facets 421A and 421B and into the slug 420 to fasten the slug 420 to the leadframe 410. The fasteners 440A and 440B can include metal rivets, pins, or bolts inserted through the downset facets 421A and 421B and into the slug 420, although solder, adhesives, wire-bonds, and other fastening means can be used in other cases.

In FIG. 14, the distance "D" between the top surface of the slug 420 and the top surface of the leadframe 410 (and of the conductive leads 412A and 412B shown in FIG. 13) can be seen. Inside the air cavity of the air cavity package to be formed from the leadframe 410 and the slug 420 shown in FIG. 14, the portions 413A and 413B of the conductive leads 412A and 412B that will be exposed within the air cavity are designated by hatching in FIG. 13. Those portions 413A and 413B of the conductive leads 412A and 412B will be exposed at a first platform level similar to the first platform levels 124A and 124B illustrated in FIGS. 1 and 2. Electrical components can be mounted and secured inside the air cavity and wire-bonded out to the exposed surfaces of the portions 413A and 413B of the conductive leads 412A and 412B as described herein.

Figure 15:
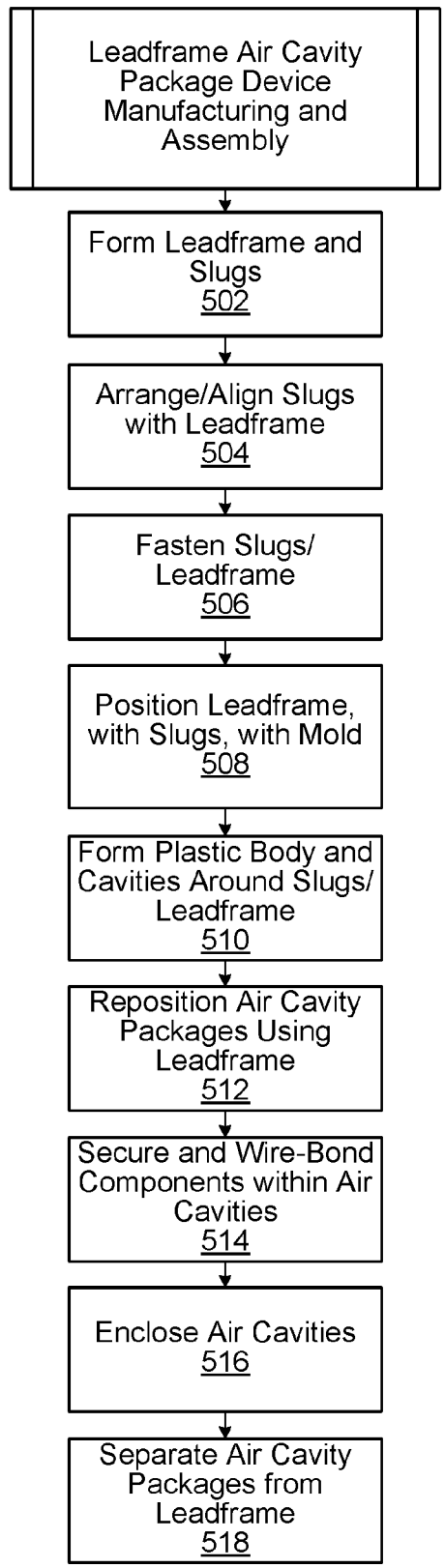
FIG. 15 illustrates a process of leadframe air cavity package device manufacturing and assembly according to an example embodiment described herein.

As noted above, using a leadframe similar to the leadframe 310 shown in FIG. 12 or the portion of the leadframe 410 shown in FIG. 14 as a starting point for the manufacture of air cavity packages offers various benefits, including significantly higher assembly throughputs, lower cost, higher precision, and the ability to use the existing tool sets and equipment of manufacturers and suppliers. In the context of manufacturing air cavity packages, FIG. 15 illustrates a process of leadframe air cavity package device manufacturing and assembly according to an example embodiment described herein. The process diagram shown in FIG. 15 provides one example of a sequence of steps that can be used to form air cavity packages as described herein and secure and wire-bond electrical components within those air cavity packages.

The steps and arrangement of the steps shown in FIG. 15 are provided by way of a representative example of one process that can be used. In other embodiments, the order of the steps can differ from that depicted. For example, an order of execution of two or more of the steps can be scrambled relative to the order shown. Also, in some cases, two or more of the steps can be performed concurrently or with partial concurrence. Further, in some cases, one or more of the steps shown in FIG. 15 can be skipped or omitted. Additionally, although the example air cavity packages described with reference to FIGS. 1-14 are referenced for context in connection with the process steps shown in FIG. 15, the process is not limited to the manufacture of any particular size, shape, or style of air cavity packages.

At reference numeral 502, the process includes forming a leadframe for one or more air cavity packages. For example, a leadframe similar to the leadframe 310 shown in FIG. 12 or the portion of the leadframe 410 shown in FIG. 14 can be formed (e.g., cut, sheared, pressed out, etc.) from a larger strip or sheet of conductive metal or metals, such as copper, aluminum, tin, silver, gold, zinc, other metals, or any compositions thereof, and can be plated with silver or gold, for example, using spot-plating or another method. The leadframe can include any suitable number of conductive leads, downset facets, leadframe structure supports, etc.

At reference numeral 502, the process can also include forming one or more slugs similar to any of the slugs 110, 210, 330-335, or 420 illustrated in FIG. 1, 11, 12, or 14, for example, using any suitable process. The slugs can be formed from copper, aluminum, tin, silver, gold, zinc, other metals, diamond, graphite, or any compositions thereof. The slugs can also be coated or plated with a material, such as gold, silver, copper, nickel, palladium, etc., which can improve the mechanical and/or electrical performance of the air cavity package or assist in the adhesion of other components to the slug. The slugs can include top and bottom major surfaces and an interlocking edge surface having a lip or tooth that runs around the outer peripheral edge of the slug as described herein.

At reference numeral 504, the process includes arranging or aligning one or more of the slugs formed at reference numeral 502 with the leadframe formed at reference numeral 502. As an example of that arrangement, FIG. 13 illustrates the slug 420 arranged in position with the leadframe 410. In practice, multiple slugs can be positioned at corresponding locations along a leadframe at reference numeral 504.

At reference numeral 506, the process includes fastening the slugs and leadframe together. Referring to FIGS. 13 and 14 for an example, metal rivets, pins, or bolts can be inserted through the apertures 422A and 422B in the downset facets 421A and 421B of the leadframe 410 to fasten the slug 420 to the leadframe 410 at reference numeral 506. While FIG. 13 illustrates a portion of the leadframe 410 and downset facets 421A and 421B for one air cavity package, similar downset facets and fastening means can be used to secure additional slugs for other air cavity packages.

At reference numeral 508, the process includes positioning the leadframe, with slugs attached, into a mold for forming the frame or body of air cavity packages. At reference numeral 510, the process includes forming a number of plastic frames or bodies (and air cavities) around the slugs and leadframe positioned at reference numeral 508. As one example, the bounding box 430 in FIG. 13 is representative of the size of a plastic frame or body of an air cavity package to be formed around the portion of the leadframe 410 shown. When the frames or bodies are formed, air cavities are formed within the frames as described herein.

The frames or bodies of the air cavity packages (and the air cavities within them) can be formed through the injection of plastic into the mold surrounding the slugs and leadframe. The frames can be molded out of any suitable plastic (or similar) material(s), such as epoxy, liquid crystal polymer (LCP), silicone, or polymide resins or blends, with or without glass, carbon, or other reinforcements, among other materials. The material(s) of the frames can be selected to provide or achieve adequate protection (e.g., an adequate level of temperature sensitivity, vibration sensitivity, moisture sensitivity, or other sensitivity level etc.) for the components to be placed within the air cavity packages being formed. The materials can also be selected for suitable mechanical, adequate matching of the thermal expansion to other materials in the package, or other relevant factors.

At reference numeral 512, the process includes repositioning the air cavity packages formed at reference numeral 510 using the supporting leadframe. That is, once a number of air cavity packages are formed or molded around the leadframe and slugs at reference numeral 510, the surrounding leadframe can be used to move the air cavity packages without repositioning them individually. The air cavity packages can be moved into machines for picking electrical components and placing the components into the air cavities of the air cavity packages and for wire-bonding those components out to the exposed conductive leads within the air cavities as described herein.

At reference numeral 514, the process includes securing various combinations of electrical components in the air cavities formed within the air cavity packages. The process also includes wire-bonding those electrical components out to the exposed conductive leads within the air cavities of the air cavity packages. As an example, FIG. 11 illustrates a top view of the example air cavity package 200 including components within an air cavity 222. In FIG. 11, the components 281-283 and 291-293 are secured to the slug 210 within the air cavity 222. Further, the components 281 are electrically coupled by wire bonds between the conductive lead 260B and the components 282, the components 282 are electrically coupled by wire bonds between the components 281 and the components 283, and the components 283 are electrically coupled by wire bonds between the components 282 and the conductive lead 260A. Similarly, the components 291 are electrically coupled by wire bonds between the conductive lead 262B and the components 292, the components 292 are electrically coupled by wire bonds between the components 291 and the components 293, and the components 293 are electrically coupled by wire bonds between the components 292 and the conductive lead 262A. The arrangement of the components 281-283 and 291-293 shown in FIG. 11 is provided by way of example, and any suitable approach to securing and wire-bonding components can be performed at reference numeral 514.

At reference numeral 516, the process includes enclosing the air cavities of the air cavity packages. For example, the cover 170 can be secured over the air cavity of the air cavity package 100 shown in FIG. 6 using any suitable adhesives or plastic welding, heating, or melting processes. A cover similar to the cover 170, for example, can be used to cover any or all of the air cavity packages formed at reference numeral 510.

At reference numeral 518, the process includes separating the air cavity packages from the leadframe. The air cavity packages can be separated from the leadframe by cutting or shearing the leadframe structure supports to separate the conductive leads of each of the air cavity packages away from the larger leadframe assembly. For example, in FIG. 13, the outline 435 is representative of a cutting or shearing line that can be used to separate the air cavity package away from the leadframe 410 (i.e., to cut the leadframe structure supports 431-434). A similar cutting or shearing line can be used to separate each of the air cavity packages 320-325 shown in FIG. 12 away from the leadframe 310.

In alternative process steps, air cavity packages can be removed (e.g., cut or sheared away) from their surrounding leadframes before electrical components are secured and enclosed within those air cavity packages, but the leadframe offers the ability to easily move several packages at a time. Thus, the use of leadframes for the manufacture of air cavity packages offers various benefits, including significantly higher assembly throughputs, lower cost, higher precision, and the ability to use the existing tool sets and equipment of manufacturers and suppliers. Further, once leadframes are formed at a suitable level of precision, the relative spacing of air cavity packages formed around and over them, is known. Thus, electrical components, such as III-Nitride material devices, among other types of devices, can be placed and interconnected within each of the air cavity packages easily by machines, without the need to move and reposition the air cavity packages individually.

As used herein, the term "µl-Nitride material" refers to any Group III element-nitride compound. Non-limiting examples of III-nitride materials include boron nitride (BN), aluminum nitride (AlN), gallium nitride (GaN), indium nitride (InN), and thallium nitride (TlN), as well as any alloys including Group III elements and Group V elements (e.g., AlxGa(1-x)N, AlxInyGa(1-x-y)N, InyGa(1-y)N, AlyIn(1-y)N, GaAsaPbN(1-a-b), AlxInyGa(1-x-y)AsaPbN(1-a-b), and the like). Typically, when present, arsenic and/or phosphorous are at low concentrations (i.e., less than 5 weight percent). III-Nitride materials can be doped n-type or p-type, or can be intrinsic. III-Nitride materials can have any polarity including but not limited to Ga-polar, N-polar, semi-polar, or non-polar crystal orientations. A III-Nitride material can also include either the Wurtzitic, Zincblende, or mixed polytypes, and can include monocrystalline, polycrystalline, or amorphous structures.

In some embodiments, the III-Nitride material comprises a gallium nitride material, as described further below. As used herein, the phrase "gallium nitride material" refers to gallium nitride (GaN) and any of its alloys, such as aluminum gallium nitride (AlxGa(1-x)N), indium gallium nitride (InyGa(1-y)N), aluminum indium gallium nitride (AlxInyGa(1-x-y)N, gallium arsenide phosoride nitride (GaAsaPbN(1-a-b)), aluminum indium gallium arsenide phosoride nitride (AlxInyGa(1-x-y)AsaPbN(1-a-b)), among others. Typically, when present, arsenic and/or phosphorous are at low concentrations (i.e., less than 5 weight percent). Gallium nitride materials can be doped n-type or p-type, or can be intrinsic.

According to certain embodiments, the substrates of the semiconductor devices (e.g., GaN-on-silicon transistor die) described herein comprise silicon (i.e., a substrate containing the element silicon in any form). Examples of substrates comprising silicon that can be used in various embodiments include, but are not limited to, silicon carbide substrates, bulk silicon wafers, and silicon on insulator substrates. In some embodiments, the substrate comprises a silicon substrate. As used herein, a silicon substrate refers to any substrate that includes a silicon surface. Examples of suitable silicon substrates include substrates that are composed entirely of silicon (e.g., bulk silicon wafers), silicon-on-insulator (SOI) substrates, silicon-on-sapphire substrate (SOS), and separation by implantation of oxygen (SIMOX) substrates, among others. Suitable silicon substrates also include composite substrates that have a silicon wafer bonded to another material such as diamond, aluminum nitride (AlN), silicon carbide (SiC), or other polycrystalline materials. Silicon substrates having different crystallographic orientations can be used, though single crystal silicon substrates can be preferred in certain, but not necessarily all, embodiments. In some embodiments, silicon (111) substrates are used. It is noted that an III-N or GaN transistor can be a III-Nitride heterostructure FET (III-N HFET), a metal-insulator-semiconductor FET (MISFET or MISHFET), such as a metal-oxide-semiconductor FET (MOSFET). Alternatively, when implemented as an HFET, III-Nitride transistor can be a HEMT configured to produce a 2 DEG.

Although embodiments have been described herein in detail, the descriptions are by way of example. The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

Therefore, the following is claimed:

1. An air cavity package, comprising:
a heat slug comprising a first major surface, a second major surface, and an interlocking edge surface;
a plastic frame that surrounds the interlocking edge surface and forms an air cavity bounded in part by the first major surface of the heat slug, the plastic frame comprising:
at least one aperture for securing the air cavity package;
a first platform level within the air cavity; and
a second platform level within the air cavity;
at least one conductive lead that extends from outside the plastic frame, through at least a portion of the plastic frame, and is exposed within the air cavity at the first platform level to bond out at least one electrical contact of a component within the air cavity; and
a strip of conductive metal that extends through at least another portion of the plastic frame and into the air cavity, the strip of conductive metal comprising a downset facet secured to the heat slug by a fastener inserted through the downset facet and into the heat slug.

2. The air cavity package of claim 1, wherein the first platform level is raised a first distance from the first major surface of the heat slug, and the second platform level is raised a second distance from the first platform level.

3. The air cavity package of claim 1, further comprising a cover seated and secured upon the second platform level to enclose the air cavity.

4. The air cavity package of claim 1, wherein the first major surface of the heat slug is exposed through the plastic frame within the air cavity, and the second major surface of the heat slug is substantially exposed through the plastic frame on an outside of the air cavity package.

5. The air cavity package of claim 1, wherein the at least one conductive lead comprises at least one aperture and the plastic frame is formed through the aperture.

6. The air cavity package of claim 1, wherein:
the at least one conductive lead comprises a plurality of electrically isolated conductive leads:
the downset facet comprises a plurality of downset facets; and
before the air cavity package is separated from a leadframe assembly, the strip of conductive metal comprises the plurality of electrically conductive leads and the plurality of downset facets.

7. The air cavity package of claim 1, wherein the first platform level within the air cavity comprises a right side platform level and a left side platform level.

8. The air cavity package of claim 7, wherein the at least one conductive lead comprises:
- a first conductive lead that extends from outside the plastic frame, through at least a portion of the plastic frame, and is exposed within the air cavity at the right side platform level; and
- a second conductive lead that extends from outside the plastic frame, through at least a portion of the plastic frame, and is exposed within the air cavity at the left side platform level.

9. An air cavity package, comprising:
- a slug comprising a first major surface, a second major surface, and an edge surface;
- a plastic frame that surrounds the edge surface and forms an air cavity bounded in part by the first major surface of the slug, the plastic frame comprising a platform level within the air cavity;
- at least one conductive lead that extends from outside the plastic frame, through at least a portion of the plastic frame, and is exposed within the air cavity at the platform level; and
- a strip of conductive metal that extends through at least another portion of the plastic frame and into the air cavity, the strip of conductive metal comprising a downset facet secured to the slug by a fastener inserted through the downset facet and into the slug.

10. The air cavity package of claim 9, wherein the platform level is raised a first distance from the first major surface of the slug.

11. The air cavity package of claim 9, further comprising a cover seated and secured upon a second platform level within the air cavity to enclose the air cavity.

12. The air cavity package of claim 9, wherein the first major surface of the slug is exposed through the plastic frame within the air cavity, and the second major surface of the slug is substantially exposed through the plastic frame on an outside of the air cavity package.

13. The air cavity package of claim 9, wherein the at least one conductive lead comprises at least one aperture and the plastic frame is formed through the aperture.

14. The air cavity package of claim 9, wherein:
- the at least one conductive lead comprises a plurality of electrically isolated conductive leads;
- the downset facet comprises a plurality of downset facets; and
- before the air cavity package is separated from a leadframe assembly, the strip of conductive metal comprises the plurality of electrically conductive leads and the plurality of downset facets.

15. The air cavity package of claim 9, wherein the platform level within the air cavity comprises a right side platform level and a left side platform level.

16. The air cavity package of claim 15, wherein the at least one conductive lead comprises:
- a first conductive lead that extends from outside the plastic frame, through at least a portion of the plastic frame, and is exposed within the air cavity at the right side platform level; and
- a second conductive lead that extends from outside the plastic frame, through at least a portion of the plastic frame, and is exposed within the air cavity at the left side platform level.

17. A leadframe assembly, comprising:
- a strip of conductive metal comprising a plurality of conductive leads and a plurality of downset facets;
- a plurality of slugs secured to the strip of conductive metal by a plurality of fasteners inserted through the plurality of downset facets and into the plurality of slugs, each of the plurality of slugs comprising a first major surface, a second major surface, and an edge surface; and
- a plastic frame that surrounds the edge surfaces of the plurality of slugs and forms an air cavity for each of a plurality of air cavity packages, wherein at least one of the plurality of conductive leads extends through at least a portion of the plastic frame and is exposed within the air cavity of at least one of the plurality of air cavity packages.

18. The leadframe assembly of claim 17, wherein each air cavity of the plurality of air cavity packages includes a platform having a portion of at least one of the plurality of conductive leads exposed within the air cavity to bond out at least one electrical contact of a component.

19. The leadframe assembly of claim 18, wherein the platform comprises a right side platform level and a left side platform level.

20. The leadframe assembly of claim 18, wherein each air cavity of the plurality of air cavity packages further includes a second platform to secure a cover and enclose the air cavity.

* * * * *